US009147793B2

(12) United States Patent
Gessert et al.

(10) Patent No.: US 9,147,793 B2
(45) Date of Patent: Sep. 29, 2015

(54) CDTE DEVICES AND METHOD OF MANUFACTURING SAME

(75) Inventors: Timothy A. Gessert, Conifer, CO (US); Rommel Noufi, Golden, CO (US); Ramesh G. Dhere, Lakewood, CO (US); David S. Albin, Denver, CO (US); Teresa Barnes, Evergreen, CO (US); James Burst, Lakewood, CO (US); Joel N. Duenow, Golden, CO (US); Matthew Reese, Golden, CO (US)

(73) Assignee: Alliance For Sustainable Energy, LLC, Golden, CO (US)

(*) Notice: Subject to any disclaimer, the term of this patent is extended or adjusted under 35 U.S.C. 154(b) by 0 days.

(21) Appl. No.: 14/127,261

(22) PCT Filed: Jun. 20, 2012

(86) PCT No.: PCT/US2012/043404
§ 371 (c)(1),
(2), (4) Date: Dec. 18, 2013

(87) PCT Pub. No.: WO2012/177804
PCT Pub. Date: Dec. 27, 2012

(65) Prior Publication Data
US 2014/0134786 A1 May 15, 2014

Related U.S. Application Data

(60) Provisional application No. 61/499,063, filed on Jun. 20, 2011, provisional application No. 61/641,802, filed on May 2, 2012.

(51) Int. Cl.
*H01L 31/18* (2006.01)
*H01L 31/073* (2012.01)

(52) U.S. Cl.
CPC .......... *H01L 31/1828* (2013.01); *H01L 31/073* (2013.01); *H01L 31/1836* (2013.01)

(58) Field of Classification Search
USPC ........................................................... 438/95
See application file for complete search history.

(56) References Cited

U.S. PATENT DOCUMENTS

| 4,296,188 A | 10/1981 | Hodes et al. |
| 5,578,502 A | 11/1996 | Albright et al. |

(Continued)

FOREIGN PATENT DOCUMENTS

| WO | 2010080282 | 7/2010 |
| WO | 2011072269 | 6/2011 |
| WO | 2011163161 | 12/2011 |

OTHER PUBLICATIONS

Sites et al., "Strategies to increase CdTe solar-cell voltage," Thin Solid Films, vol. 515, Issue 15, May 2007, pp. 6099-6102.

(Continued)

*Primary Examiner* — Asok K Sarkar
(74) *Attorney, Agent, or Firm* — John C. Stolpa; Suzanne C. Walts

(57) ABSTRACT

A method of producing polycrystalline CdTe materials and devices that incorporate the polycrystalline CdTe materials are provided. In particular, a method of producing polycrystalline p-doped CdTe thin films for use in CdTe solar cells in which the CdTe thin films possess enhanced acceptor densities and minority carrier lifetimes, resulting in enhanced efficiency of the solar cells containing the CdTe material are provided.

14 Claims, 6 Drawing Sheets

(56) References Cited

U.S. PATENT DOCUMENTS

| | | | |
|---|---|---|---|
| 5,909,632 | A | 6/1999 | Gessert |
| 6,281,035 | B1 | 8/2001 | Gessert |
| 6,458,254 | B2 | 10/2002 | Gessert |
| 7,608,830 | B1 | 10/2009 | Kinch |
| 7,858,872 | B2 | 12/2010 | Hotz et al. |
| 2005/0151131 | A1* | 7/2005 | Wager et al. ............ 257/51 |
| 2010/0180935 | A1 | 7/2010 | Chen |
| 2010/0186810 | A1 | 7/2010 | Romeo |
| 2010/0236607 | A1 | 9/2010 | Korevaar et al. |
| 2010/0276785 | A1 | 11/2010 | Kamath et al. |
| 2011/0139249 | A1 | 6/2011 | Garnett et al. |
| 2011/0143489 | A1 | 6/2011 | Korevaar |
| 2011/0143492 | A1 | 6/2011 | DeLuca et al. |
| 2011/0146784 | A1 | 6/2011 | Addepalli et al. |
| 2011/0214709 | A1 | 9/2011 | Evelsizer et al. |
| 2011/0259423 | A1 | 10/2011 | Korevaar et al. |
| 2011/0259424 | A1 | 10/2011 | Basol |
| 2011/0265865 | A1 | 11/2011 | Korevaar |
| 2012/0024380 | A1 | 2/2012 | Feldman-Peabody et al. |
| 2012/0040516 | A1 | 2/2012 | Xia |
| 2012/0042950 | A1 | 2/2012 | Chin |
| 2012/0103261 | A1 | 5/2012 | Johnson et al. |
| 2012/0295396 | A1* | 11/2012 | Teeter et al. ............ 438/95 |

OTHER PUBLICATIONS

Zunger, "Practical Doping Principles," Applied Physics Letters, vol. 83, Issue 1, Jul. 2007, pp. 57-59.

Gessert et al., "Formation of ZnTe:CuTi Contacts at High Temperature for CdS/CdTe Devices," Proc. 4th World Conference on Photovoltaic Energy Conversion, Waikoloa, Hawaii, May 7-12, 2006, pp. 1-4.

Gessert at al., "Spectroscopic Cathodoluminesense Studies of the ZnTe:Cu Contact Process for CdS/CdTe Solar Cells," Proc. 29th IEEE Photovoltaic Specialists Conference, Piscataway, New Jersey, May 19-24, 2002, pp. 535-538.

Nakazawa et al., "High efficiency indium oxide/cadmium telluride solar cells," Applied Physics Letters, vol. 50, Feb. 2, 1987, pp. 279-280.

Bonnet et al., "New Results on the Development of Thin Film p-CdTe-nCdS Heterojunction Solar Cell," 9th IEEE Photovoltaic Specialists Conference, Silver Springs, Maryland, May 2-4, 1972, pp. 129-132.

Corwine et al., "CdTe photoluminescence; Comparison of solar-cell material with surface-modified single crystals," Applied Physics Letters, vol. 86, Issue 22, May 30, 2005, pp. 221909-1-221909-3.

Ma et al., "Carrier density and compensation in semiconductors with multiple dopants and multiple transition energy levels: Case of Cu impurities in CdTe," Physical Review B, vol. 83, Issue 24, Jun. 11, 2011, pp. 245207-1-245207-7.

Chakrabarti, et al., "Surface photovoltage measurement in CdS/CdTe solar cell: Grain boundary effect," Solar Energy Materials & Solar Cells, vol. 61, Issue 2, Mar. 1, 2000, pp. 113-126.

PCT/US2012/043404 International Search Report and Written Opinion dated Jan. 2013.

Gessert, "Some Possible Direction and Challenges for CdTe Thin-Film PV Solar Cells," NREL Polycrystalline Group Meeting, Dec. 15, 2006, pp. 1-11.

Gessert, T. A., et al., "Research strategies toward improving thin-film CdTe photovoltaic devices beyond 20% conversion efficiency", *Solar Energy Materials and Solar Cells*, vol. 119, Dec. 2013, pp. 149-155.

Sugiyama, K., "Properties of CdTe Films Grown on InSb by Molecular Beam Epitaxy", *Thin Solid Films*, vol. 115, Issue 2, May 11, 1984, pp. 97-107.

Dhese, K. A., et al., "Photoluminescence and p-type conductivity in CdTe:N grown by molecular beam epitaxy", *Journal of Applied Physics*, vol. 76, Issue 9, Nov. 1, 1994, pp. 5423-5428.

Baron, T., et al., "Nitrogen doping of Te-based II-VI compounds during growth by molecular beam epitaxy", *Journal of Applied Physics*, vol. 83, Issue 3, Feb. 1, 1998, pp. 1354-1370.

Gessert, T. A., et al., "Development of CdTe on Si Heteroepilayers for Controlled PV Material and Device Studies", *Mater. Res. Soc. Symp. Proc.*, vol. 1538, Apr. 1-5, 2013, San Francisco, California, pp. 243-248.

Dehoff, R. T., *Thermodynamics in Materials Science*, McGraw-Hill (1993), New York, New York, pp. 422-423.

Babalola, O. S., "Surface and Bulk Defects in Cadmium Zinc Telluride and Cadmium Manganese Telluride Crystals", Dissertation Submitted to the Faculty of the Graduate School of Vanderbilt University, Interdisciplinary Materials Science, Dec. 2009, Nashville, Tennessee, p. 26.

* cited by examiner

CDTE DEVICES AND METHOD OF MANUFACTURING SAME

CROSS REFERENCE

This application claims priority from U.S. Provisional Patent Application No. 61/499,063, filed on Jun. 20, 2011, entitled "Improved CdTe Devices and Methods of Manufacturing Same," and U.S. Provisional Patent Application No. 61/641,802, filed May 2, 2012, entitled "Improvement of CdTe Photovoltaic Device Performance by Back Contact Enhancements," the contents of both are incorporated herein by reference.

CONTRACTUAL ORIGIN

This invention was made with government support under Contract No. DE-AC36-08GO28308 between the United States Department of Energy and the Alliance for Sustainable Energy, LLC, the Manager and Operator of the National Renewable Energy Laboratory.

TECHNICAL FIELD

The present disclosure relates to methods of producing CdTe semiconductor devices with enhanced functional qualities. In particular, the present disclosure relates to methods of producing polycrystalline p-doped CdTe thin films for use in CdTe solar cells in which the CdTe thin films possess enhanced acceptor densities and minority carrier lifetimes, resulting in enhanced efficiency of the solar cells containing the CdTe material.

BACKGROUND

Cadmium telluride (CdTe) is a semiconductor material that has been used in both its crystalline and (thin-film) polycrystalline forms for optoelectronic applications. CdTe is highly effective at converting terrestrial sunlight into electrical power by virtue of its bandgap energy of about 1.5 eV at room temperature. In addition, CdTe is transparent to infrared light ranging in wavelength from about 860 nm to greater than about 20 µm. As a result, very thin layers of CdTe of about 1 µm thickness may be incorporated into the construction of efficient photovoltaic (PV) devices. CdTe thin-film PV modules are widely recognized as an attractive option for large-scale renewable electricity production.

Commercial-scale CdTe solar cell fabrication processes presently deposit and cure polycrystalline CdTe using substantially similar processes. Historically, at least several process enhancements have been incorporated into these commercial-scale polycrystalline CdTe production methods to mitigate performance shortcomings of the deposited polycrystalline CdTe layer related to various material defects. These process enhancements may include: adding or not actively eliminating oxygen during CdTe deposition; performing a $CdCl_2$ and/or oxygen "activation" process to the deposited CdTe layer; and diffusing Cu into the deposited CdTe layer from the back contact.

Although these process enhancements may reduce the detrimental effect of material defects such as Te vacancy defects ($V_{Te}$), other deep-donor and deep-acceptor defects may be formed that may limit minority carrier lifetime (τ) within the CdTe layer. Because these τ-limiting deep donor and deep-acceptor defects are relatively stable, it may be challenging to lengthen the carrier minority lifetime of polycrystalline CdTe material beyond those of existing materials produced using current production methods.

Although many commercially-available CdTe PV modules provide average conversion efficiency of about 12%-13% at a relatively low production cost, the bandgap value of CdTe predicts that even higher conversion efficiencies may be achieved. Most ongoing efforts to enhance device performance above the record device efficiency of 17% involve device design improvements that aim to mitigate materials-based shortcomings of the CdTe absorber layer and the n-p junction. The quality of the n-p junction, typically assessed in terms of $V_{oc}$, the open circuit voltage of the device, is thought to be one key to realizing higher-performing CdTe PV modules. Efforts to enhance $V_{oc}$ generally entail increasing the net acceptor concentration in the CdTe layer and the inclusion of an intrinsic CdTe layer situated between the n and p layers of the junction of the solar cell.

Increasing the net acceptor doping in CdTe has been considered as one means of increasing $V_{oc}$. Elevated $V_{oc}$ for PV devices may occur when the net-donor ($N_D$) and net-acceptor ($N_A$) densities are increased on the n and p side of the semiconductor junction, respectively. Without being limited to any particular theory, it is believed that $N_A$ may be increased from typical thin-film values of about mid-$10^{13}$ cm$^{-3}$ to values of about $10^{15}$ cm$^{-3}$ before self-compensation limits further increases in $N_A$. Cu diffused into the CdTe layer from the back contact of a superstrate device design has been found to enhance the performance of CdS/CdTe cells in one approach. Although this "excessive" Cu diffusion into the CdTe layer may increase $N_A$ above that typically used for existing CdS/CdTe devices, a concurrent increase in device performance may not be observed because the Cu may also diffuse into the CdS layer, which may reduce net donor densities ($N_D$). In addition, this increase in $N_A$ may narrow the depletion width ($W_D$) in the device so that it becomes situated shallower in the device than the optical-absorption depth. Further, because minority-carrier lifetime for electrons in polycrystalline CdTe is relatively short (≤2 ns), the diffusion length for minority carriers generated outside $W_D$ may be too short to provide effective collection, further impacting device performance. Because the $W_D$ reduces even further in forward bias, the device fill factor (FF) may decrease due to voltage-dependant collection, which may offset any performance improvement from higher $V_{oc}$. Thus, increasing $V_{oc}$ solely by increasing $N_A$ may not improve device performance unless τ of the p-CdTe layer is also increased.

An alternative method considered to increase $V_{oc}$ may be to incorporate an intrinsic layer of CdTe (i-CdTe) between the thin n and p layers of the junction, resulting in an n-i-p device design. Although the τ of thin-film p-CdTe may be on the order of about 1-2 ns, the τ of thin-film i-CdTe produced using existing methods may be less than about 0.1 ns. Therefore, photogenerated carriers in the i-CdTe may recombine before the electric field can drift them to their respective n- or p-type layer for collection. Thus, increasing $V_{oc}$ by using an n-i-p device design may not produce higher device performance unless the τ in the i-CdTe is also increased.

Ongoing efforts to enhance the $V_{oc}$ in existing CdTe PV modules may be limited by the relatively short minority carrier lifetime τ in the polycrystalline p-CdTe and i-CdTe materials produced using existing methods. The minority carrier lifetime in crystalline CdTe may be significantly longer than that observed in existing polycrystalline CdTe thin films, indicating that the short τ associated with polycrystalline CdTe produced using current methods may not be an intrinsic material property of CdTe, but more likely may be due to defects related to the nature of the thin-film polycrystalline material and/or production process conditions. Considering both the benefits and detriments of existing CdTe production and post-deposition enhancement processes, it may be beneficial to develop novel processes to produce a polycrystalline CdTe film with fewer vacancy defects such as $V_{Te}$ or $V_{Cd}$, which may simultaneously increase $V_{oc}$ and minority carrier lifetime, rather than reducing the detrimental effects of these defects using existing production methods which reduce minority carrier lifetime.

Therefore, there is a need for an improvement of the processes used to deposit polycrystalline CdTe absorber material on a substrate which simultaneously increases $V_{oc}$ and minority carrier lifetime and which results in improved CdTe device performance. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Aspects of the present disclosure provide a method of depositing a layer of a material composed of polycrystalline CdTe onto a substrate. This method includes providing to a deposition process a source material that includes an amount of Cd and an amount of Te in a non-stoichiometric ratio. The non-stoichiometric ratio consists of either a Cd-rich ratio having a larger atomic percentage of Cd relative to the atomic percentage of Te, or a Te-rich ratio having a larger atomic percentage of Te relative to the atomic percentage of Cd.

Other aspects further provide a method of depositing a layer of a material composed of polycrystalline CdTe and at least one additional element incorporated into a crystalline lattice of the polycrystalline CdTe onto a substrate. This method includes providing to a deposition process a source material that includes an amount of Cd and an amount of Te in a non-stoichiometric ratio and an amount of the at least one additional element. The non-stoichiometric ratio consists of either a Cd-rich ratio having a larger atomic percentage of Cd relative to the atomic percentage of Te, or a Te-rich ratio having a larger atomic percentage of Te relative to the atomic percentage of Cd. In addition, the additional element may be chosen from an acceptor dopant, a donor dopant, an isoelectronic dopant, and any combination thereof.

Additional aspects further provide a method of forming an ohmic contact on an exposed surface of a polycrystalline CdTe layer. This method includes providing to a deposition process a source material that includes an amount of Cd and an amount of Te in a non-stoichiometric ratio and an amount of the at least one additional element. The non-stoichiometric ratio consists of either a Cd-rich ratio having a larger atomic percentage of Cd relative to the atomic percentage of Te, or a Te-rich ratio having a larger atomic percentage of Te relative to the atomic percentage of Cd. In addition, the additional element may be chosen from an acceptor dopant, a donor dopant, an isoelectronic dopant, and any combination thereof. The method further includes depositing a contact layer onto the exposed surface.

The method of producing a polycrystalline CdTe layer overcomes many of the limitations of previous fabrication methods. The use of non-stoichiometric ratios of Cd and Te reduce many recombination-related defects, thereby enhancing the minority carrier lifetime to a value of over 10 ns. Further, the polycrystalline CdTe material resulting from aspects of this method further includes a crystal lattice structure that is energetically receptive for the incorporation of additional elements such as acceptor dopants and donor dopants with minimal impact on the minority carrier lifetime. The simultaneous achievement of relatively high minority carrier lifetime and relatively high net acceptor or donor concentration within the polycrystalline CdTe material results in the enhancement of the efficiency of devices such as photovoltaic cells that incorporate these CdTe materials.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

Corresponding reference characters and labels indicate corresponding elements among the view of the drawings. The headings used in the figures should not be interpreted to limit the scope of the claims.

DETAILED DESCRIPTION

In an aspect, a method of depositing a layer of a material composed of polycrystalline CdTe onto a substrate is provided that overcomes many of the limitations of previous polycrystalline CdTe production methods. In this aspect, this method includes providing to a deposition process one or more source materials that includes an amount of Cd and an amount of Te in a non-stoichiometric ratio consisting of either a Cd-rich ratio or a Te-rich ratio. This imbalance between the Cd and Te concentrations provided to the deposition process in this aspect may result in a polycrystalline material with one or more benefits over polycrystalline CdTe produced using existing methods including, but not limited to, the simultaneous enhancement of acceptor density and minority carrier lifetime, as described in detail herein below.

Further, the lattice structure of the polycrystalline material produced using this method may energetically favor the incorporation of additional elements, included in the source material, at particular locations within the CdTe lattice, such as at Cd vacancies or at Te vacancies, as the lattice is formed. The additional elements incorporated into the CdTe lattice may include donor dopants and acceptor dopants. For example, an acceptor dopant may be incorporated into the CdTe polycrystalline layer produced using this method to produce a p-doped CdTe polycrystalline layer.

The polycrystalline CdTe materials produced using various aspects of the method may facilitate the formation of ohmic contacts on the exposed surface of the CdTe layer of a CdTe photovoltaic device. In particular, p-doped or n-doped CdTe materials may be particularly amenable to the construction of relatively low-resistance ohmic contacts as described in detail herein below.

Figure 1:
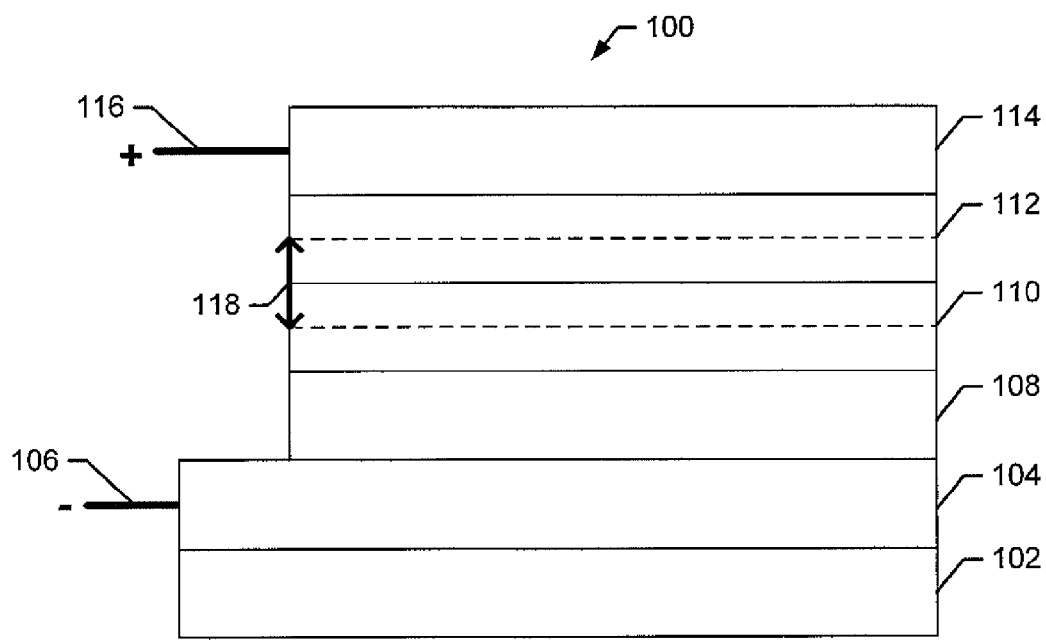
FIG. 1 is a schematic diagram of a polycrystalline CdTe photovoltaic cell with a p-n design.
Figure 2:
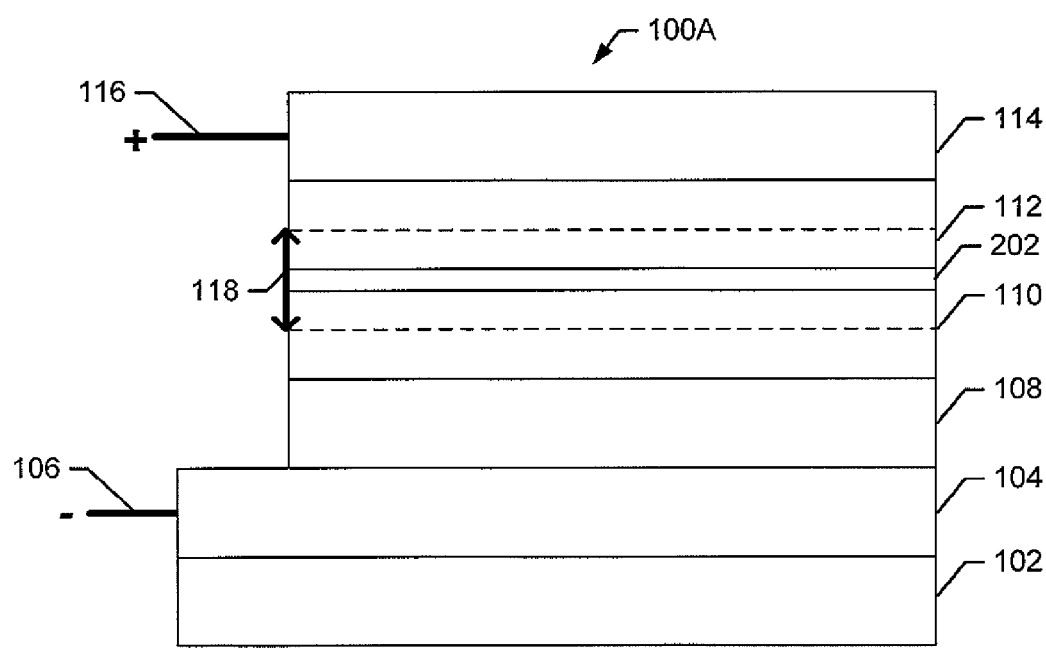
FIG. 2 is a schematic diagram of a polycrystalline CdTe photovoltaic cell with a p-i-n design.

The materials and ohmic contacts described herein may be incorporated into a polycrystalline CdTe photovoltaic device without limitation as to design. A p-n photovoltaic device 100 in one aspect is illustrated in FIG. 1. The photovoltaic device may include a glass superstrate 102 upon which a front contact 104, typically formed as a layer of a transparent conductive oxide (TCO) is deposited. The front contact may be electrically connected to an anode 106. A buffer layer 108 may also be formed on the front contact 104 to reduce the resistance of the front contact 104. An n-doped CdS layer 110 may be deposited on the buffer layer 108, and a p-doped CdTe layer 112 may be deposited onto the n-doped CdS layer 110, forming a p-n junction. A back contact 114 may be deposited into the p-doped CdTe layer 112; the back contact 114 may be electrically connected to a cathode 116. At the p-n junction, the adjoining donors and acceptors within the n-doped CdS layer 110 and the p-doped CdTe layer 112 may combine, resulting in a depletion region having a depletion width 118, within which there are relatively few mobile charge carriers. A p-i-n photovoltaic device 100A in another aspect is illustrated in FIG. 2. In addition to the layers 102, 104, 108, 110, 112, and 114 described previously in connection with the p-n photovoltaic device 100, the p-i-n photovoltaic device 100A further includes an intrinsic CdTe layer 202 situated between the n-doped CdS layer 108 and the p-doped CdTe layer 110. Other aspects may include substrate or superstrate devices, devices including continuous and/or discontinuous layers or films, and any other design known in the art.

Methods of depositing a layer of a material composed of polycrystalline CdTe onto a substrate, methods of depositing a layer of a material composed of polycrystalline CdTe with at least one additional element incorporated into the CdTe lattice, and methods of forming ohmic contacts on a CdTe layer are described in detail herein below.

I. Methods of Depositing Polycrystalline CdTe

A method of depositing a layer of a material including polycrystalline CdTe onto a substrate is provided in an aspect. In this aspect, the method includes providing a source material including an amount of Cd and an amount of Te to a deposition process in a non-stoichiometric ratio consisting of either a Cd-rich ratio or a Te-rich ratio. The resulting polycrystalline CdTe may have a minority carrier lifetime of at least about 10 ns in this aspect.

Various aspects of the method may result in an overall reduction in defects within the crystal lattice structure of the polycrystalline CdTe that in turn may enhance the minority carrier lifetime. Without being limited to any particular theory, the excess of Cd or Te associated with the non-stoichiometric ratio of Cd:Te in the source material is thought to result in a corresponding excess of Cd or Te in the resulting polycrystalline CdTe layer deposited in the substrate. The excess Cd or Te in the polycrystalline CdTe layer may predominantly reside within the interfacial regions of the polycrystalline materials. The excess Cd or Te within the interfacial regions may influence the lattice composition and properties within the crystalline regions of the polycrystalline CdTe layer. For example, an excess of Te in the interfacial regions of a polycrystalline CdTe layer may result in an inhibition of the formation of Te void defects ($V_{Te}$) within the material, thereby reducing the overall defects in the polycrystalline CdTe material; the elimination of these defects may be associated with the enhancement of minority carrier lifetime.

In addition, the polycrystalline CdTe material produced by various aspects of the method may energetically favor the incorporation of one or more additional elements at specific lattice points within the material. Returning to the previous example, an excess of Te in the interfacial regions, and the associated inhibition of the formation of $V_{Te}$ defects results in a relative abundance of Cd void defects ($V_{Cd}$). This relative abundance of $V_{Cd}$ defects may energetically favor the incorporation of at least one element into the CdTe material by substitution into a Cd void defect. If Cu is the element to be incorporated, for example, the material may energetically favor a $Cu_{Te}$ substitution of Cu into the Te void defect over other Cu incorporations such as an interstitial substitution of Cu ($Cu_i$). Further description of the incorporation of various elements into the CdTe crystal lattice in various aspects of the method is provided herein below.

a. Polycrystalline CdTe

In various aspects, a polycrystalline CdTe layer may be deposited on a substrate. In general, crystalline CdTe is a binary, single-phase, semiconducting material that exists as a zincblende-type crystal lattice having a Cd:Te stoichiometric ratio of essentially 50:50. However, according to known phase diagrams of crystalline CdTe, the crystalline material may sustain a deficiency of Cd or Te in the lattice. The lattice may sustain a Cd deficiency (i.e., Cd void defects $V_{Cd}$) up to a defect density of about $14 \times 10^{17}$ cm$^{-3}$ (corresponding to about 0.014 atomic % of the material) and a Te deficiency (i.e. Te void defects $V_{Te}$) up to a defect density of about $5 \times 10^{17}$ cm$^{-3}$ (corresponding to about 0.005 atomic % of the material) before the Te and/or Cd deficiencies will spontaneously produce separate Cd or Te metallic phases. Although this percentage of Cd or Te deficiency is relatively small, it represents a defect concentration that may significantly impact the electrical properties of the CdTe material.

Much of the present understanding of how the Cd:Te stoichiometric ratio affects the electrical properties of CdTe may stem primarily from previous studies involving single-crystal CdTe materials. Although many physical, chemical, and electrical attributes of single-crystal and polycrystalline thin films may be similar, the grain boundaries within polycrystalline CdTe may further influence these attributes in a manner not observed in single crystal CdTe material. For example, when the growing surface of a single-crystal CdTe layer is deficient in Cd or Te, layer growth will slow to adjust to the availability of each element. By way of contrast, during the growth of a polycrystalline CdTe layer, grains that are deficient in Te or Cd may coalesce, thereby tolerating much higher stoichiometric variation ranges than might be inferred from the growth of single-crystal CdTe materials.

In an aspect, a single-phase homogeneous region of CdTe, corresponding to a local crystal region within the polycrystalline CdTe material, may possess a Cd:Te atomic ratio ranging from about 50.005/49.995 ("Cd-rich stoichiometry") to about 49.986/50.014 ("Te-rich stoichiometry"). The range of Cd:Te atomic ratios within a single-phase homogeneous region may be influenced by one or more factors including, but not limited to, temperature, the formation of single-element metal phases, and the degree of doping and/or other impurities within the CdTe crystal lattice. The Cd-rich stoichiometry may represent the maximum atomic ratio at which a CdTe lattice may resist the formation of a Cd metal phase. Similarly, the Te-rich stoichiometry may represent the maximum atomic ratio at which a CdTe lattice may resist the formation of Te metal phase. In addition, higher crystal lattice temperatures may result in a higher range of off-stoichiometric atomic ratios.

In another aspect, the method used to produce the polycrystalline CdTe material inhibits the formation of recombination-related defects that may reduce the minority carrier lifetime within the material. In one aspect, the density of recombination-related defects within an undoped polycrystalline CdTe material may be less than about $10^{15}/cm^3$. In another aspect, the density of recombination-related defects within an undoped polycrystalline CdTe material may be less than about $10^{14}/cm^3$. In another aspect, the density of recombination-related defects within an undoped polycrystalline CdTe material may be less than about $10^{13}/cm^3$.

In yet another aspect, the CdTe layer may have a minority carrier lifetime ($\tau$) of greater than about 10 ns. In other aspects, $\tau$ may range from about 5 ns to about 10 ns, from about 9 ns to about 12 ns, from about 11 ns to about 15 ns, from about 14 ns to about 20 ns, and from about 19 ns to about 25 ns.

In an aspect, the polycrystalline CdTe layer may be deposited to a layer thickness ranging from about 0.5 µm to about 25 µm thick. In other aspects, the polycrystalline CdTe layer may be deposited to a layer thickness ranging from about 0.5 µm to about 2 µm thick, from about 1 µm to about 3 µm thick, from about 2 µm to about 4 µm thick, from about 3 µm to about 5 µm thick, from about 4 µm to about 8 µm thick, from about 5 µm to about 10 µm thick, from about 8 µm to about 15 µm thick, from about 10 µm to about 20 µm thick, and from about 15 µm to about 25 µm thick.

The polycrystalline CdTe material may form part of a CdTe photovoltaic cell or other semiconductor device as a thin layer. As such, the CdTe may be n-doped, isoelectronic, or p-doped, depending on the function of the CdTe layer within the PV cell or other device. Aspects of the method related to the production of doped polycrystalline CdTe materials are described in further detail herein below.

b. Substrate

The CdTe layer may be deposited on any known suitable substrate including, but not limited to, glass, CdS, CdS:O, or any other substrate known in the art. The glass material may include, but is not limited to, aluminosilicate, borosilicate, soda lime glass, or any other glass. In an aspect, the substrate may range from about 1 mm thick to about 10 mm thick. In other aspects the glass thickness may range from about 1 mm to about 3 mm, from about 2 mm to about 4 mm, from about 3 mm to about 5 mm, from about 4 mm to about 6 mm, from about 5 mm to about 7 mm, from about 6 mm to about 8 mm, from about 7 mm to about 9 mm, and from about 8 mm to about 10 mm.

In another aspect, the CdS:O or CdS layers may be deposited by chemical bath deposition, high-vacuum evaporation at about 200° C., vapor-transport deposition (VTD), close-spaced sublimation (CSS), or any other method of deposition known in the art. In an aspect, the CdS layer may be deposited on a bi-layer $SnO_2$/glass substrate. The CdS layer may be about 0.3 µm thick in one aspect.

c. Source Material

In various methods, a source material that includes an amount of Cd and an amount of Te in a non-stoichiometric ratio may be provided to a deposition process to deposit the layer of polycrystalline CdTe on the substrate. The non-stoichiometric ratio may include a Cd-rich ratio having a larger atomic percentage of Cd relative to the atomic percentage of Te. Alternatively, the non-stoichiometric ratio may include a Te-rich ratio having a larger atomic percentage of Te relative to the atomic percentage of Cd.

In yet another aspect, the CdTe source material may have a structure and/or stoichiometry that may yield excess Te or Cd or may increase the active incorporation of particular dopants. In an aspect, Cd may be delivered from the source material to the substrate at an atomic percentage of Cd up to about 10 times the atomic percentage of the Te. In another aspect, Te may be delivered from the source material to the substrate at an atomic percentage of Te up to about 10 times the atomic percentage of the Cd. In yet another aspect, the atomic concentration of Te may be at least 5% higher than the atomic concentration of Cd in the source material.

The CdTe source material may be in any form known in the art, including, but not limited to, solid, vapor, or solution forms. In a solid form, the source material may be in the form of a powder, discrete particles, chunks, or any combination thereof. The form of source material used may depend on the deposition method used for depositing the CdTe layer.

The source material may be a single CdTe compound, or the source material may include Cd in a separate compound from Te. Any known Cd, Te, and/or CdTe compound may be used as a source material. In one aspect, the source material is selected to be compatible with the selected deposition method. In another aspect, the source material may be single-crystal and/or polycrystalline CdTe in a powder or granular form. In this aspect, the polycrystalline CdTe material may possess a Cd:Te atomic ratio ranging from about 50.005:49.995 ("Cd-rich stoichiometry") to about 49.986:50.014 ("Te-rich stoichiometry"). In yet another aspect, the source material may include excess Cd or Te in an excess amount of about 40 ppm.

In an aspect, the source material may include one or more unintentional impurities resulting from their fabrication. These impurities may be incorporated into the polycrystalline CdTe material during the deposition of the CdTe layer. In one aspect, if the source material is a powder or granular form of a polycrystalline CdTe material, the impurities may be included in the source material at a concentration ranging from about $10^{13}/cm^3$ to about $10^{17}/cm^3$. In another aspect, the impurities may represent potential acceptor impurities and potential donor impurities. Potential acceptor impurities may include those that replace Cd in the CdTe lattice including, but not limited to: Li, Na, K, Rb (referred to herein as Group 1A impurities) and Cu, Ag, and Au (referred to herein as Group 1B impurities). Potential acceptor impurities may further include those that replace Te in the CdTe lattice including, but not limited to: V, Nb, and Ta (referred to herein as Group 5A impurities) and N, P, As, Sb, and Bi (referred to herein as Group 5B impurities). Potential donor impurities may include those that replace Cd in the CdTe lattice including, but not limited to: Sc, Y, and La (referred to herein as Group 3A impurities) and B, Al, Ga, and In (referred to herein as Group 3B impurities). Potential donor impurities may include those that replace Te in the CdTe lattice including, but not limited to: Mn, Tc (referred to herein as Group 7A impurities) and F, Cl, Br, and I (referred to herein as Group 7B impurities). Non-limiting examples of potential isoelectronic impurities include Be, Mg, Ca, Sr, Ba (referred to herein as Group 2A impurities), Cr, Mo, W (referred to herein as Group 6A impurities), Zn, Hg (referred to herein as Group 2B impurities), and O, S, and Se (referred to herein as Group 6B impurities).

The density of lattice sites within the CdTe crystal lattice may be about $10^{22}/cm^3$. An impurity of $10^{13}/cm^3$ in the CdTe crystal lattice represents an impurity of 1 part per billion. The advertised purity of the commercial-grade CdTe source material may range from about 99.999% to about 99.9999%+. The 99.999% pure source material may have 0.001% impurities, corresponding to an impurity of about $10^{17}/cm^3$. The 99.9999%+ pure source material may have less than 0.0001% impurities, corresponding to an impurity of less than $10^{16}/cm^3$.

In addition to the impurities, the source material may include at least one additional impurity intentionally incorporated as an acceptor dopant, a donor dopant, an isoelectronic dopant, and any combination thereof. Non-limiting examples of acceptor dopants include the Group 1A, 1B, 5A and 5B impurities described herein previously. Non-limiting examples of donor dopants include the Group 3A, 3B, 7A, and 7B impurities described herein previously. Non-limiting examples of potential isoelectronic dopants include the Group 2A, 6A, 2B, and 6B impurities described herein previously.

The one or more additional impurities may be included in the source material to produce a net acceptor ($N_A$) or net donor ($N_D$) density concentration ranging from about $1 \times 10^{14}$ $cm^{-3}$ to about $1 \times 10^{20}$ $cm^{-3}$ in an embodiment. In other embodiments, one or more additional impurities may be included in the source material to produce a net acceptor ($N_A$) or net donor ($N_D$) density concentration ranging from about $1 \times 10^{14}$ $cm^{-3}$ to about $1 \times 10^{16}$ $cm^{-3}$, from about $1 \times 10^{15}$ $cm^{-3}$ to about $1 \times 10^{17}$ $cm^{-3}$, from about $1 \times 10^{16}$ $cm^{-3}$ to about $1 \times 10^{18}$ $cm^{-3}$, from about $1 \times 10^{17}$ $cm^{-3}$ to about $1 \times 10^{19}$ $cm^{-3}$, and from about $1 \times 10^{18}$ $cm^{-3}$ to about $1 \times 10^{20}$ $cm^{-3}$. Without being limited to any particular theory, the one or more additional impurities may be incorporated into the polycrystalline CdTe material independently of the concentration of the additional impurities in the source material. For example, the incorporation of an additional impurity may be limited by the availability of substitution sites within the crystal lattice of the polycrystalline CdTe material.

Typically, an additional impurity may be incorporated into the polycrystalline CdTe material by a substitution into a void defect in the crystal lattice; such substitutions typically result in a relatively shallow donor or acceptor defect, which enhance overall device performance. As discussed herein previously, the use of a source material having a Cd-rich ratio or a Te-rich ratio may result in a polycrystalline CdTe material in which the incorporation of an impurity into a Te void defect or a Cd void defect, respectively, are favored energetically.

In another aspect, the additional impurity that is incorporated into the polycrystalline CdTe material by substitution into a Cd void defect may be added to a source material with a Te-rich ratio. Non-limiting examples of additional impurities incorporated as acceptors into the polycrystalline CdTe material by substitution into a Cd void defect include the Group 1A and 1B elements. Non-limiting examples of additional impurities incorporated as donors into the polycrystalline CdTe material by substitution into a Cd void defect include the Group 3A and 3B elements. In an additional aspect, the additional impurity that is incorporated into the polycrystalline CdTe material by substitution into a Te void defect may be added to a source material with a Cd-rich ratio. Non-limiting examples of impurities incorporated as acceptors into the polycrystalline CdTe material by substitution into a Te void defect include the Group 5A and 5B elements. Non-limiting examples of impurities incorporated as donors into the polycrystalline CdTe material by substitution into a Te void defect include the Group 7A and 7B elements.

d. Deposition Process

In an aspect, the polycrystalline CdTe material is deposited by providing to a deposition process a source material as described previously herein. In another aspect, the deposition process, or post-deposition process, may be performed in the absence of oxygen and $CdCl_2$. Without being limited to any particular theory, the use of a Te-rich ratio or Cd-rich ratio source material in a deposition process conducted without the intentional inclusion of oxygen or $CdCl_2$ may ameliorate many of the oxygen and chlorine-related treatment effects described previously herein.

Without being limited to any particular theory, the inclusion of process enhancements such as exposure of the CdTe material to oxygen and $CdCl_2$ during or after deposition may add complexity to the number and functionality of defects within the CdTe materials. As produced using existing methods, vacancy defects such as $V_{Te}$ or $V_{Cd}$ may be present in sufficient concentration to affect material quality and impact PV device performance. It may be thermodynamically favorable for oxygen to occupy a $V_{Te}$ site, thereby limiting the detrimental effect of the $V_{Te}$ defect by conversion to an $O_{Te}$ defect; however the $O_{Te}$ is likely to form a deep-defect complex with acceptor impurities, such as copper, that may also be included in the source material or intentionally introduced as an acceptor dopant. The $CdCl_2$ treatment may also reduce $V_{Te}$ through formation of the so-called "chlorine A-center" defect complex (i.e., $V_{Cd}$—$Cl_{Te}$). Finally, depending on the extent of $V_{Cd}$ remaining after the $CdCl_2$ treatment, Cu may form a $Cu_{Cd}$ substitutional defect that may act as an acceptor. Unfortunately, the ionization energy of the $Cu_{Cd}$ defect is greater than the $V_{Cd}$ defects it may replace, with the result that the net acceptor density at room temperature may actually decrease as Cu is incorporated.

The CdTe polycrystalline material may be grown on the substrate using any method known in the art, including but not limited to, cathodic arc deposition, electron beam physical vapor deposition (PVD), evaporative deposition, pulsed laser deposition, sputter deposition, close-space sublimation (CSS), vapor transport deposition (VTD), electrodeposition, electroless deposition, metal organic chemical vapor deposition, spray deposition, application of nanostructures, and screen print deposition.

In one aspect, the deposition process may be physical vapor deposition. The basis for physical vapor deposition of CdTe is the condensation of Cd and $Te_2$ vapors: $Cd + \frac{1}{2}Te_2 \leftrightarrow CdTe$. As a consequence, CdTe may be deposited by coevaporation from elemental sources, by direct sublimation from a CdTe source or by vapor transport using a carrier gas to entrain and may deliver Cd and $Te_2$ vapors from either elemental or CdTe sources. In an aspect, congruent sublimation of the CdTe compound may fix the g-asphase composition for deposition from a CdTe source, and the relatively low vapor pressure of CdTe compared to elemental Cd and Te may facilitate the deposition of single-phase solid films over a wide range of substrate temperatures.

The PVD may be conducted at a moderate vacuum pressure of about $10^{-6}$ Torr, with a CdTe source effusion cell with about 0.5-cm-diameter orifice and a temperature of about 800° C., at a source to substrate distance of about 20 cm. A deposition rate of about 1 lam/min may be obtained on a substrate at a sufficiently low temperature (about 100° C.) for Cd and Te sticking coefficients to approach unity. At higher substrate temperatures, the sticking coefficients of impinging Cd and Te may decrease, resulting in a lower deposition rate, which may impose a practical limit to substrate temperature of less than about 400° C. for modest CdTe utilization. In another aspect, as-deposited films may exhibit preferred orientation and normal grain-size distribution with a mean grain diameter that may depend on film thickness and substrate temperature; for about 2-µm-thick films, the mean grain diameter may range from about 100 nm at about 100° C. to about 1 µm at about 350° C.

Using the CSS technology, CdTe may be deposited with a very high deposition rate. In an aspect, the close space distance may be generally smaller than a few percent of the substrate dimensions. In order to ensure that the condensation process may be limited to the small distance area between substrate and source material and that the desired temperature-depending dissociation pressure may be obtained, pressure and temperature of source material and substrate may be sensitively adapted to each other.

To evaporate CdTe films onto substrates at temperatures above 400° C., reevaporation of Cd and Te from the growing CdTe surface may limit the deposition rate and utilization. In an aspect, this may be mitigated by depositing at higher total pressure, about 1 Torr, but mass transfer from the source to the substrate may become diffusion-limited, so the source and substrate may be brought into close proximity. In an aspect, CdTe may be deposited by CSS at a temperature of about 450° C. to about 620° C.

In CSS deposition processes, the CdTe source material may be supported in a holder having approximately the same area as the substrate; the source holder and substrate cover may serve as susceptors for radiative heating and may conduct heat to the CdTe source and the substrate, respectively. In another aspect, an insulating spacer may allow thermal isolation of the source from the substrate, so that a temperature differential may be sustained throughout the duration of the deposition. The ambient air for deposition may contain, but is not limited to, a nonreactive gas such as $N_2$, Ar, or He. In another aspect, as-deposited CSS films deposited above 550° C. may exhibit nearly random grain orientation and normal grain size distribution with mean grain size that may be comparable to film thickness.

In yet another aspect, the deposition process may be vapor transport deposition (VTD). VTD may allow a high-rate of deposition at high substrate temperatures and at pressures approaching about 0.1 atm onto moving substrates. While CSS is diffusion-limited, VTD works by convective transfer of a vapor stream saturated with Cd and Te to the substrate, where supersaturation of the Cd and Te vapors results in condensation and reaction to form CdTe. In an aspect, the CdTe source may consist of a heated chamber containing solid CdTe in which the carrier gas may mix with the Cd and Te vapors and may be exhausted through a slit over or under the moving substrate at a distance on the order of about 1 cm. The geometrical configuration of the source may influence the uniformity and utilization of the vapors in the carrier gas. In another aspect, the carrier-gas composition may be varied, as with CSS, to include, but is not limited to, $N_2$, Ar, and He. As-deposited VTD films may have nearly random orientation and normal grain size distribution with mean grain size that may be comparable to film thickness. The VTD process may provide a very high deposition rate onto moving substrates.

In one VTD deposition process, the CdTe source material may be packed into a 1 in diameter quartz tube that may be heated by nichrome ribbon wrapped around its exterior. One end of the packed-bed source may be terminated by a porous quartz frit, while helium carrier gas may be introduced at the other end. Saturated vapor may excite the quartz frit and may impinge on a heated substrate located a distance away in the stagnation flow configuration. The helium flow rate may be varied from about 100 to about 500 sccm using an electronic mass flow controller. The temperature of both source and substrate may be measured with type K thermocouples and maintained at desired values using resistive heating and feedback control. The source and substrate pressure may be monitored using convection gauges.

CdTe films may also be deposited by radio-frequency magnetron sputtering from compound targets. In an aspect, mass transfer of Cd and Te may occur via ablation of the CdTe target by $Ar^+$, followed by diffusion to the substrate and condensation. Typically, deposition may be carried out at a substrate temperature less than about 300° C. and at pressures about 10 mTorr. In another aspect, as-deposited films about 2-µm-thick deposited at about 200° C. may exhibit mean grain diameter about 300 nm and may have nearly random orientation.

In another additional aspect, the deposition method may be electrodeposition. Electrodeposition of CdTe consists of the galvanic reduction of Cd and Te from $Cd^{+2}$ and $HTeO_2^+$ ions in acidic aqueous electrolyte. The large difference in reduction potential may necessitate limiting the concentration of the more positive species, Te, to maintain stoichiometry in the deposit. The low Te species concentration ($10^{-4}$ M) may limit the CdTe growth rate due to Te depletion in the solution at the growing surface and subsequent mass transport. To overcome this, the electrolyte may be vigorously stirred, and different methods of Te replenishment may be employed. Thickness and deposition area may be limited by the ability to maintain deposition potential over the entire surface of the growing film. In an aspect, as-deposited films may be fabricated as stoichiometric CdTe, Te-rich (by increasing Te species concentration in the bath) or Cd rich (by depositing at low potentials with limited Te species concentration). In another aspect, as-deposited electrodeposited CdTe films on CdS thin-film substrates may exhibit strong orientation with columnar grains that may have a mean lateral diameter of about 100 to about 200 nm.

In still another aspect, the deposition method may be spray deposition. Spray deposition is a nonvacuum technique for depositing CdTe from a slurry containing CdTe and a carrier which may include, but is not limited to, propylene glycol. The slurry may be sprayed onto unheated or heated substrates, after which a reaction/recrystallization treatment may be performed. In an aspect of spray deposition to CdTe films, the mixture may be sprayed onto the substrates at room temperature and baked at about 200° C., followed by a bake at about 350 to about 550° C., a mechanical densification step, and a final treatment at about 550° C. Films produced by this technique may vary in morphology, grain size, and porosity, but films used to make high-efficiency cells may exhibit an about 1- to about 2-µm-thick dense region near the CdTe/CdS interface, a relatively porous back surface region, and random crystallographic orientation.

In another aspect, the deposition method may be screen-print deposition. Screen-print deposition may combine Cd, Te, and a suitable binder into a paste that may be applied to the substrate through a screen. Following a drying step to remove binder solvents, the layer may be baked at temperatures up to about 700° C. to recrystallize the film and activate the junction. Films fabricated by this method typically may have a thickness ranging from about 10 to about 20 μm with lateral grain dimension of about 5 μm and random orientation.

e. Addition of Excess Cd or Te to Device

In an aspect, Te, Cd, a Te-containing material, or a Cd-containing material may be added to an exposed surface of the post-deposited CdTe layer. This aspect may include depositing a doped or undoped contact interface layer that may contain Te, Cd, excess Cd, or excess Te and providing thermal treatment designed to enable Te or Cd diffusion into the CdTe layer. Non-limiting examples of contact interface layers include ZnTe, ZnTe:Cu, Te, CuTe, or any other contact layer known in the art.

In another aspect, a Te, Cd, Cd-containing, or Te-containing layer may be added within the structure. The Te, Cd, Cd-containing, or Te-containing layer may be at an interface between layers of different or similar materials, for example, CdS/Te/CdTe, ZnTe/Te/ZnTe:Cu, CdTe/Te/CdTe, or any other layer that may be used in the PV device.

II. Methods of Forming Ohmic Contacts on Polycrystalline CdTe Layers in Semiconductor Devices It has been historically difficult to fabricate a reproducible, low-resistance, ohmic back contact to the polycrystalline CdTe layer typically used for superstrate CdS/CdTe photovoltaic (PV) devices. This may be partly because a potential barrier forms at the interface between p-type CdTe and contact metals, thereby limiting current transport. In addition, the process of forming ohmic contacts further needs to modify the CdTe layer so that the energy due to light absorption may be optimally collected. These modifications may include increasing the p- or n-type doping so that the PV device may support the electric field required for effective charge separation, and may increase the minority carrier lifetime so that minority carriers may survive long enough to be separated and collected before recombining. Existing CdTe back contact formation process must accomplish these multiple functions simultaneously.

The electrical performance of the back contact polycrystalline CdTe material may be influenced by the presence of various intrinsic defects. The defects most often discussed are Cd and Te vacancies ($V_{Cd}$ and $V_{Te}$; i.e., resulting from not enough Cd or Te, respectively), Cd and Te interstitials (i.e., resulting from too much Cd or Te, respectively), and antisite defects (Cd on a Te site and vise-versa).

In an aspect, the method for depositing polycrystalline CdTe layers on a substrate may produce a CdTe material that simultaneously reduces these various intrinsic defects, increases net acceptor density to a range of about $1 \times 10^{14}$ cm$^{-3}$ to about $1 \times 10^{20}$ cm$^{-3}$, and increases the minority carrier lifetime to at least 10 ns. Because all of the performance-limiting material properties of the CdTe layer have already been addressed, the process of forming an ohmic contact may be significantly simplified.

In one aspect, the method of forming an ohmic contact on an exposed surface of a polycrystalline CdTe layer includes depositing the polycrystalline CdTe layer and at least one additional element incorporated into a crystalline lattice of the polycrystalline CdTe onto a substrate using the methods described previously herein above. If the net acceptor density or the net donor density of the CdTe layer as deposited is greater than about $1 \times 10^{18}$ cm$^{-3}$, low contact resistance may result if an appropriate metal layer is deposited directly on the exposed CdTe surface.

In another aspect, the exposed surface of the CdTe layer may be subjected to a preconditioning process to produce a pre-conditioned exposed surface that includes either a Te-rich stoichiometry or a Cd-rich stoichiometry. Non-limiting examples of suitable preconditioning processes include: etching the exposed surface using an etching process chosen from: chemical etching process, a physical etching process, a thermal etching process and any combination thereof; contacting the exposed surface to a vapor that includes Cd, Te, and any combination thereof; and depositing Cd or Te onto the exposed surface to form a layer of pure Cd or pure Te on top of the exposed CdTe surface.

Any known etching process may be selected as the preconditioning process. Non-limiting examples of chemical etching processes include etching the exposed CdTe surface with an etchant chosen from $HNO_3$, $H_3PO_4$, hydrazine, a metal alkalide, and any combination thereof. Non-limiting examples of physical etching processes include plasma etching, reactive ion etching, and ion implantation. Non-limiting examples of thermal etching processes include annealing, rapid thermal processing, optical processing, and any combination thereof.

The exposed CdTe surface may be exposed to a vapor of Cd and/or Te using any known method, including but not limited to the vapor transport deposition (VTD) method described herein above. A layer of pure Cd or Te may be deposited onto the exposed CdTe surface using any of the deposition processes described herein above, using a source material consisting of or containing either Cd or Te.

The preconditioned CdTe surface includes a Cd-rich or a Te-rich stoichiometry similar to the non-stoichiometric composition of the polycrystalline CdTe material produced by the methods described herein previously. As described previously herein above, this Cd-rich or a Te-rich stoichiometry of the preconditioned CdTe surface may result in a lattice structure that is energetically receptive for the incorporation of additional elements including, but not limited to atoms from the metal layer. In addition, the preconditioning process may eliminate any contaminants including, but not limited to oxygen and nitrogen, that may have been incorporated into the CdTe material due to exposure to air between phases of the fabrication process.

In another aspect, an interface layer may be deposited on the exposed CdTe surface prior to depositing the metal layer on the interface layer. The interface layer may include a highly doped ZnTe material containing at least one dopant chosen from any of the acceptor impurities/dopants and any of the donor acceptors/dopants described herein above in connection with the CdTe dopants. Non-limiting examples of specific dopants include Cu, N, Au, Ag, P, and As. In an additional aspect, a first interface layer of intrinsic ZnTe may be deposited upon the exposed surface of the CdTe layer, followed by a second interface layer of a metal alloy deposited upon the first interface layer, followed by the metal layer deposited upon the second interface layer.

In an aspect, the metal alloy may include a first element chosen from Column 1A or Column 1B and a second element chosen from Column 5A or Column 5B. In another aspect, the metal alloy may be TiP. In an additional aspect, the metal layer may include at least one layer of one or more metals chosen from Mo, Ti, Ni, Al, Nb, W, Cr, and Cu.

The selected compositions for one or more metal alloys, metal layers, and interface layer or layers may be selected based on any relevant factor known in the art, including but not limited to: the reduction of resistance across the CdTe/contact junction; facilitating quantum mechanical tunneling of charges across the CdTe/contact junction; enhancing the adhesion of the metal layer and interface layers to their respective underlying surfaces; and protection against exposure to environmental contaminants such as oxygen or nitrogen. Significantly, when high net acceptor or donor concentration in the CdTe layer can be achieved, a wider range of ohmic junction materials may be considered relative to previous ohmic contact fabrication methods.

In general, the various aspects of this method may be used to fabricate an ohmic contact on either a p-CdTe material or an n-CdTe material.

EXAMPLES

The following examples illustrate various aspects of the present disclosure.

Example 1

Effect of Te-Enriched and Cd-Enriched Stoichiometry on Performance Characteristics of Polycrystalline CdTe Solar Cells To demonstrate the effect of the composition of the CdTe source materials used to produce thin polycrystalline CdTe on the characteristics of the solar cells incorporating these thin polycrystalline layers, the following experiments were conducted. CdS/CdTe solar cells were fabricated that included CdTe films deposited by close-spaced sublimation (CSS) using four source material compositions as described in Table 1 below: a Cd-rich source material (Redlen Technologies, B.C., Canada), a stoichiometric source material (Redlen Technologies, B.C., Canada), a Te-rich source material (Redlen Technologies, B.C., Canada), and an industrial-grade 99.999% pure source material commonly used in CdTe deposition processes (product number 14365; Alfa-Alsar, Ward Hill, Mass., USA).

TABLE 1

Source Materials for CSS Deposition of Polycrystalline CdTe

| Source Material | Cd:Te Atomic Ratio |
| --- | --- |
| Cd-rich | 50.002/49.998 |
| Stoichiometric | 50.0/50.0 |
| Te-rich | 49.998/50.002 |
| Industrial-grade (control) | Not available |

The Cd-rich, stoichiometric, and Te-rich source materials were analyzed using glow discharge mass spectrometry (GDMS) to identify trace impurities. In particular, the levels of trace impurities consisting of common elements which might act as either acceptors (Group I(a), II(b), VI(a), and VI(b)) or donors (Group III(a), III(b), VII(a), VII(b)) in CdTe were detected. Although trace impurities were detected in all three source materials at levels of approximately $10^{13}/cm^3$ to over $10^{16}/cm^3$, the level of each detected impurity was consistent among all three source material compositions tested.

CdS/CdTe solar cells were fabricated using each of the four CdTe source materials summarized in Table 1 using a standard fabrication procedure. An 80-nm CdS film was grown by chemical-bath deposition (CBD) on a bi-layer $SnO_2$/glass substrate. The polycrystalline CdTe film was deposited by CSS using a source temperature of 660° C., a substrate temperature of 620° C., a deposition time of 4 minutes, and an ambient atmosphere consisting of 1 torr of oxygen and 15 torr of helium. After the deposition of the CdTe layer, the film stack was treated in $CdCl_2$ vapor+100 torr of oxygen and 400 torr of helium for 4 minutes at 400° C. The exposed surface of the CdTe layer was etched prior to forming the ohmic contact using a mixture of nitric and phosphoric acids diluted with water (commonly referred to as a NP etch) for about 20 seconds. An ohmic contact was formed on the etched CdTe surface by applying a ($Cu_{1.4}$Te+HgTe+graphite) back contact dag with annealing at 260° C. for 20 minutes in helium, followed by a final application of Ag-paste with a final air anneal at 100° C. for 60 minutes.

The open-circuit voltage ($V_{oc}$), short-circuit current density $J_{sc}$ ($mA/cm^2$), fill factor FF (%), and efficiency η (%) of the solar cells as a function of the source materials shown in Table 1 were assessed using standard measurement techniques; the results of these measurements are summarized in Table 2. In general, the performance characteristics of the solar cells produced using the Te-rich, stoichiometric, and Cd-rich source materials were enhanced relative to the industrial grade source material. Most likely, the industrial-grade source material was of lower purity than the other source materials, which impacted the performance of the industrial-grade solar cells. Comparing the solar cells produced using the other three source materials, the solar cell performance characteristics of the solar cells produced using the Cd-rich source material were highest, followed by the solar cells produced using the stoichiometric source material, and then the solar cells produced using the Te-rich source material.

TABLE 2

Performance Characteristics of Solar Cells - Effect of CdTe Source Material

| Source Material | CdTe layer thickness (μm) | $V_{oc}$ (volts) | $J_{sc}$ ($mA/cm^2$) | FF (%) | Efficiency (%) |
| --- | --- | --- | --- | --- | --- |
| Te-rich | 6.9 | 0.807 | 22.42 | 65.69 | 11.87 |
| Stoichiometric | 8.4 | 0.809 | 22.50 | 66.44 | 12.10 |
| Cd-rich | 8.3 | 0.818 | 22.59 | 66.70 | 12.33 |
| Industrial-grade (control) | 7.2 | 0.802 | 22.14 | 66.18 | 11.93 |

Figure 3:
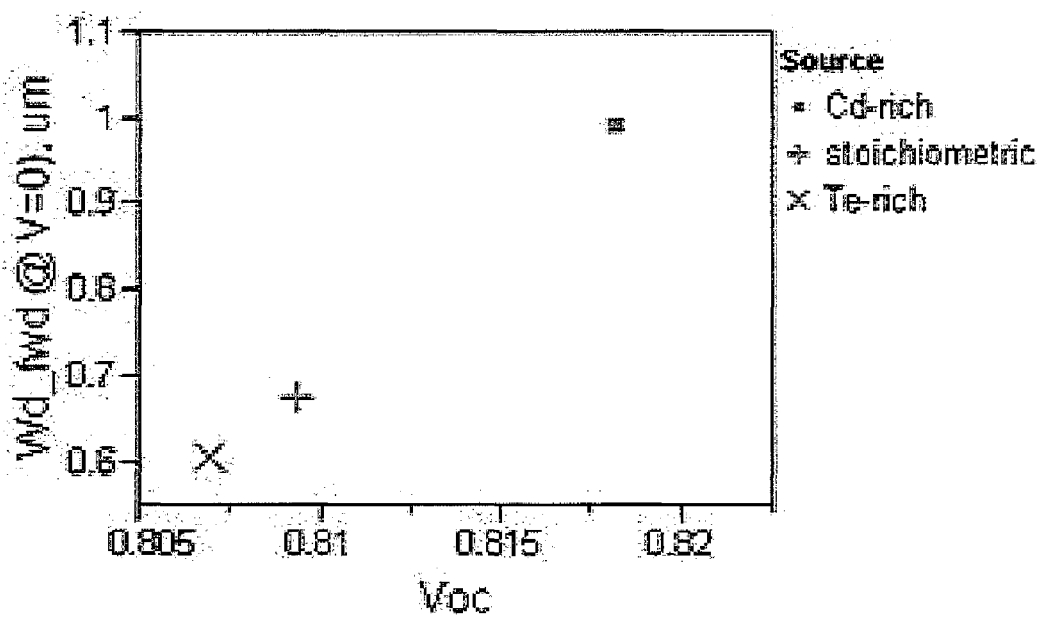
FIG. 3 is a graph summarizing depletion width as a function of open circuit voltage for PV cells made using three CdTe source compositions.
Figure 4:
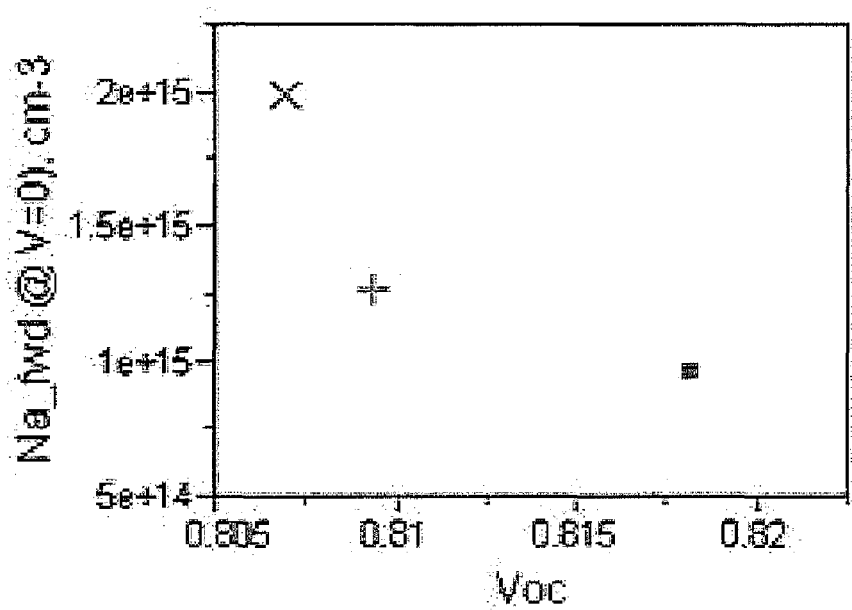
FIG. 4 is a graph summarizing net acceptor density at zero bias as a function of open circuit voltage for PV cells made using three CdTe source compositions.

In addition, the solar cells were subjected to capacitance-voltage measurements to assess the net acceptor-density, $N_a$, and depletion width, $W_d$ of the devices. As summarized in FIG. 3, the highest net acceptor-density was observed in the solar cell fabricated from the Te-rich source material. However, the solar cell fabricated from the Te-rich source material also had the lowest depletion width $W_d$. Although the performance of the Te-rich solar cell may have been enhanced by the higher net acceptor density, the associated reduction in depletion width more than offset this advantage. As evidenced by the overall efficiency of the solar cells summarized in Table 2, the Cd-rich solar cell may have struck the best balance between enhanced acceptor density and reduced depletion width among the group of solar cells in this experiment.

The results of this experiment demonstrated that the performance of a thin-film polycrystalline CdTe solar cell may be sensitive to the composition of the source material used to produce the polycrystalline CdTe layer.

Example 2

Effect of Te-Enriched and Cd-Enriched Stoichiometry on Characteristics of Phosphorus-Doped Polycrystalline CdTe Photovoltaic Devices To demonstrate the effect of the composition of the CdTe source materials used to produce thin polycrystalline phosphorus-doped CdTe on the characteristics of the solar cells incorporating these thin polycrystalline layers, the following experiments were conducted. CdS/CdTe:P solar cells were fabricated that included CdTe films deposited by close-spaced sublimation (CSS) using three source material compositions as described in Table 3 below: "P, Cd-rich," indicating P doping to a GDMS measured level of $1\times10^{18}$ cm$^{-3}$ within a composition containing 40 ppm excess Cd; and "P, Te-rich," indicating P doping to an estimated level of $1\times10^{19}$ cm$^{-3}$ within a composition containing 100 ppm excess Te. In addition, the undoped, industrial-grade CdTe source material described in Example 1 was used as a control case. Solar cells were produced using these three source materials using processes similar to those described in Example 1. However, because phosphorus is thought to be potentially reactive with oxygen during this process, solar cells were produced both with oxygen (100 torr of oxygen and 400 torr He) and without oxygen (500 torr He only).

TABLE 3

Source Materials for CSS Deposition of Polycrystalline CdTe:P

| Source Material | Cd:Te Atomic Ratio | Phosphorus Doping Level (cm$^{-3}$) |
|---|---|---|
| P, Cd-rich | 50.002/49.998 | $1 \times 10^{18}$ |
| P, Te-rich | 49.995/50.005 | $1 \times 10^{19}$ |
| Industrial-grade, undoped | Unknown | 0 |

The performance characteristics of the solar cells produced using the three source materials were assessed using methods similar to those described in Example 1. A summary of the comparisons of open-circuit voltage ($V_{oc}$), short-circuit current density (mA/cm$^2$), fill factor FF (%), and efficiency η (%) of the solar cells is provided in FIGS. 5-8, respectively. Also illustrated in FIGS. 5-8 are the results of a statistical analysis of variance (ANOVA) among the datasets; the upper and lower extent of the diamonds in these figures represent the 95% confidence intervals for each device's sample population mean.

Figure 5:
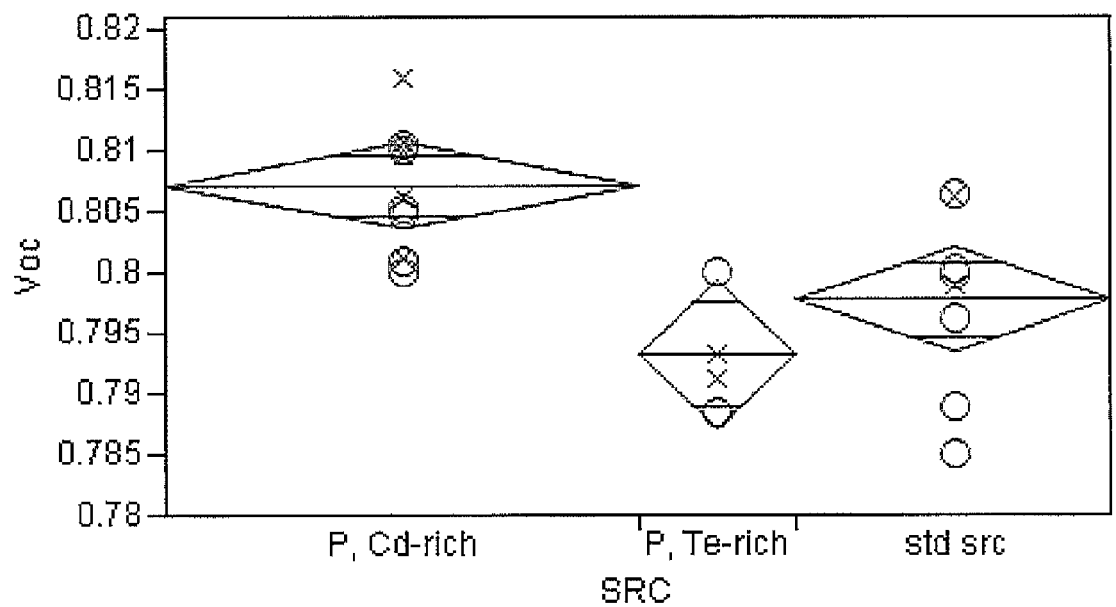
FIG. 5 is a graph summarizing open circuit voltage for PV cells made using three CdTe source compositions.
Figure 6:
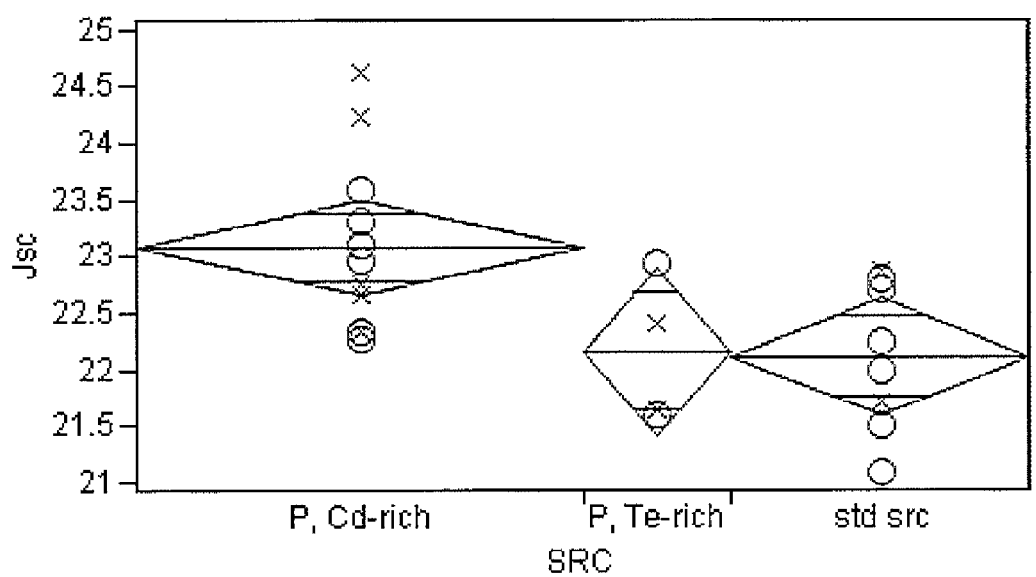
FIG. 6 is a graph summarizing current density for PV cells made using three CdTe source compositions.
Figure 7:
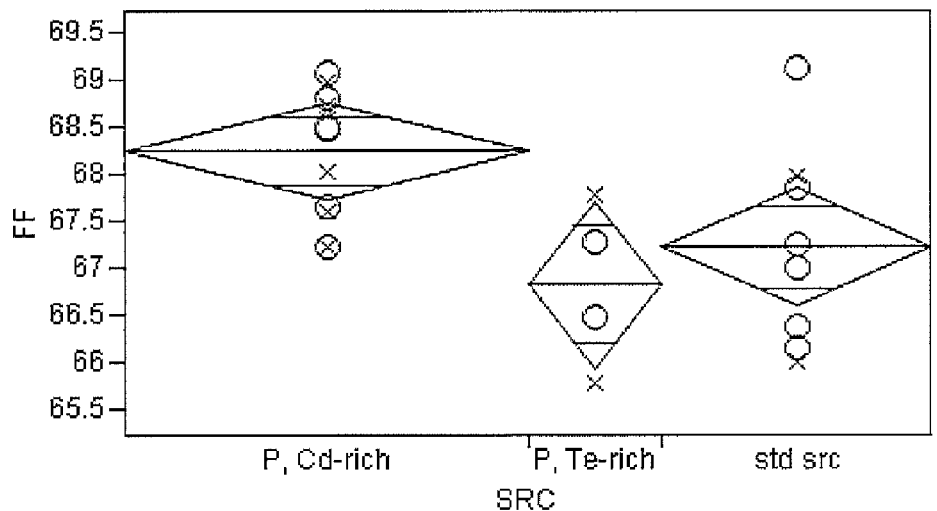
FIG. 7 a graph summarizing the fill factor for PV cells made using three CdTe source compositions.
Figure 8:
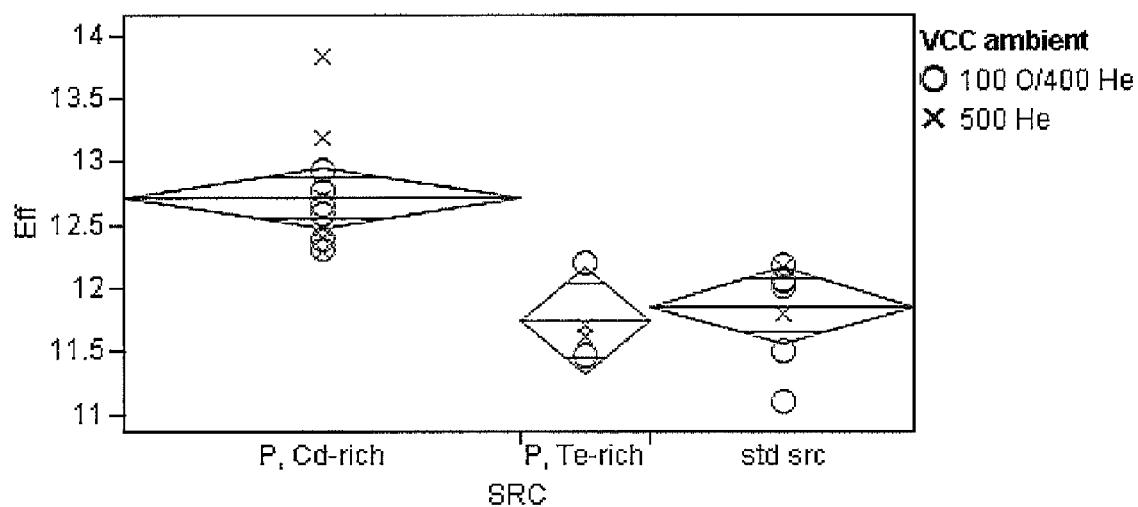
FIG. 8 is a graph summarizing the collection efficiency for PV cells made using three CdTe source compositions.

As summarized in FIG. 5 and FIG. 6, the solar cell produced using the Cd-enriched and P-doped source material exhibited statistically significant enhanced performance with respect to $V_{oc}$ and efficiency. This was likely due to the incorporation of the phosphorus into the CdTe lattice as a $P_{Te}$ substitution; the Cd enrichment of the source material likely made this substitution energetically favorable relative to other incorporations such as interstitial $P_i$.

The results of this experiment demonstrated that the performance of polycrystalline CdTe:P solar cells may be influenced by the composition of the source material used to produce the polycrystalline CdTe:P layer.

Example 3

Effect of Te-Enriched Ohmic Contact Interface Stoichiometry on Characteristics of CdTe Photovoltaic Devices To demonstrate the effect of the composition of the CdTe interface with the ohmic contact on the performance of a solar cell incorporating a thin polycrystalline CdTe layer, the following experiment was conducted. A general process as described below was used to produce solar cells having the following structure: glass/SnO$_2$:F/SnO$_2$/CdS:O/CdTe/ZnTe:Cu/Ti. Chemical vapor deposition (CVD) was used to deposit the TCO layers by reaction of tetramethyl tin+oxygen+bromotrifluoromethane for the SnO$_2$:F layer, and by reaction of tetramethyl tin+oxygen for the SnO$_2$ layer. The CdS:O layer was deposited by chemical bath deposition. The polycrystalline CdTe layer was deposited by close-space sublimation (CSS) at 600° C. followed by a treatment in CdCl$_2$ vapor at 400° C. for 5 min. Two different pre-conditioning treatments were applied to the exposed CdTe layer prior to the formation of the ohmic back contacts.

In the first treatment, the layered material including the CdTe exposed surface was placed into a multisource vacuum-processing chamber and preheated for 120 min to a contact-deposition temperature of 340° C. Prior to ZnTe:Cu deposition, approximately 100 nm of material was removed using Ar ion-beam milling with a 3-cm Kaufman-type ion gun, operating at a beam energy and current of 500 eV and 6 mA, respectively. ZnTe:Cu layers (2 wt. % Cu) were deposited by r.f. sputtering to a thickness of 0.4 μm followed by the formation of a 0.5-μm Ti layer deposited using d.c. magnetron sputtering. The contacted samples were allowed to cool in the vacuum chamber for at least 2 hrs after Ti deposition.

In the second treatment, the layered material including the CdTe exposed surface was exposed to Te as the sample temperature was raised to 340° C. in the multisource vacuum-processing chamber in order to add a small amount of Te to the exposed CdTe surface. The ZnTe:Cu and Ti layers were formed over the preconditioned CdTe surface in a manner similar to that used in the first treatment.

Following the two contact formation processes, a pattern of individual 0.25-cm$^2$ cells was defined photolithographically on all samples. TFT Ti Etchant (Transene Co. Inc., Rowley, Mass.) was used to remove the Ti layer, followed by etching with an aqueous solution of 39% FeCl$_3$ to remove the ZnTe:Cu and CdTe layers. A perimeter contact onto the SnO$_2$ layer was formed with soldered indium.

The resulting solar cells were subjected to performance measurements using a variety of methods: light/dark current voltage (LIV/DIV) measurements, capacitance voltage measurements at 100 kHz, (CV), room-temperature spectroscopic photoluminescence (RTPL), low temperature spectroscopic photoluminescence (LTPL), time-resolved photoluminescence (TRPL), and secondary ion mass spectrometry (SIMS) measurements.

Figure 9:
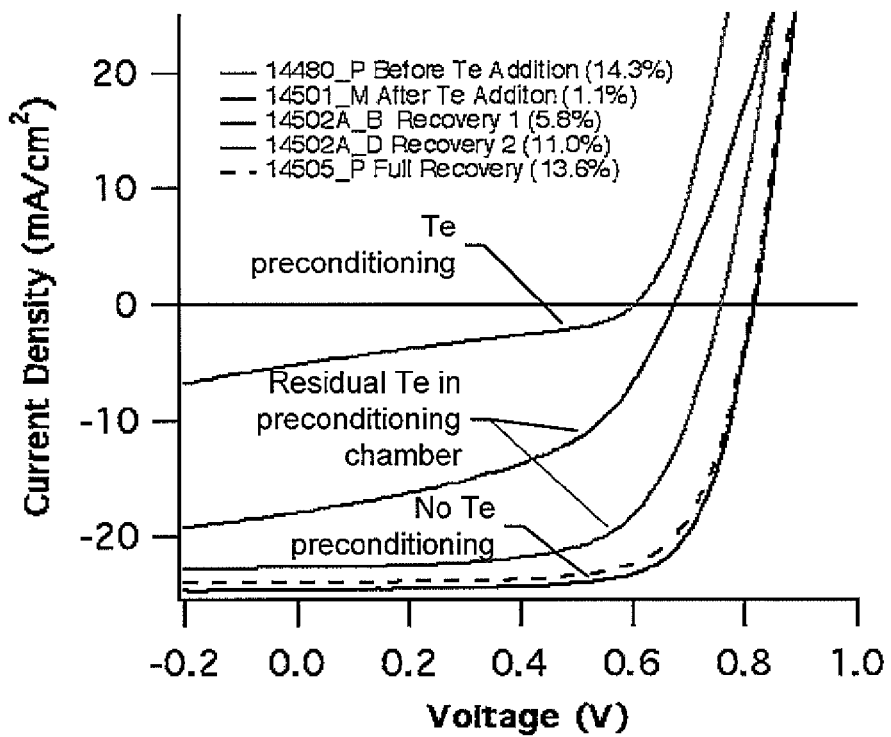
FIG. 9 is a graph summarizing the light current voltage measurements for photovoltaic devices exposed to varying concentrations of Te during the ohmic contact fabrication process.

The results of the LIV measurements indicated a dramatic reduction in LIV efficiency due to Te exposure during pre-conditioning of the CdTe surface. When the back surface of the devices was exposed to Te in the second treatment, the LIV efficiency dropped to ~1%, compared to the efficiency of about 14% achieved using the first surface treatment, as illustrated in FIG. 9. This reduction in LIV efficiency due to Te exposure was attenuated as the residual Te remaining in the multisource vacuum-processing chamber was gradually cleared during the fabrication of subsequent devices.

Figure 10:
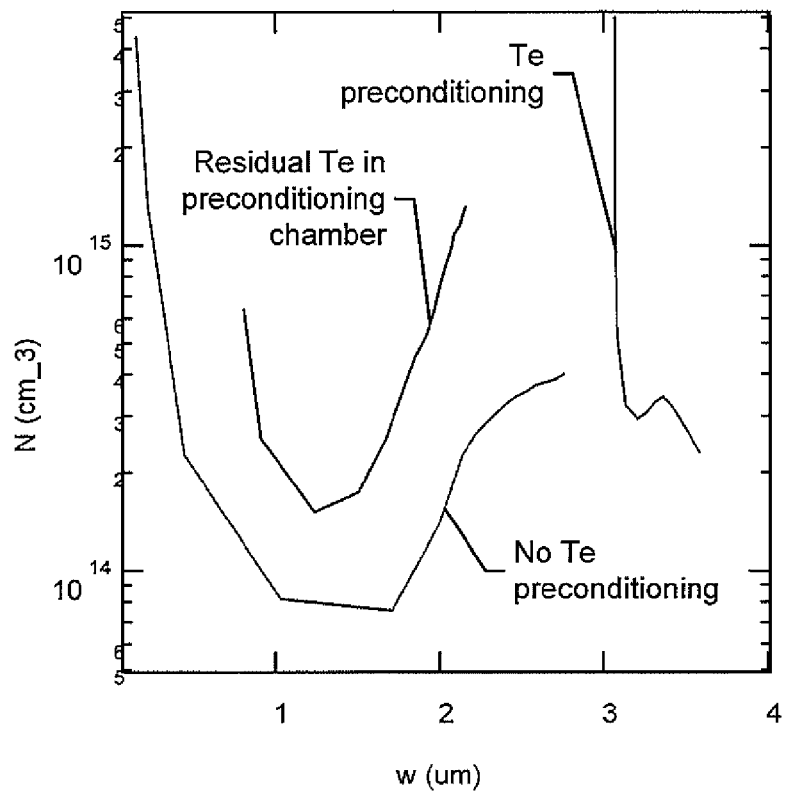
FIG. 10 is a graph summarizing net acceptor density as a function of depletion width for photovoltaic devices exposed to varying concentrations of Te during the ohmic contact fabrication process.

The results of the dark CV measurements indicated a significant increase in the depletion width of the device due to exposure to Te during preconditioning of the CdTe surface. This increase in depletion width was relatively insensitive to device bias, indicating that the net acceptor density was reduced due to Te exposure. FIG. 10 summarizes the results of the dark CV measurements for varying levels of Te exposure during CdTe surface preconditioning. As the exposure of the CdTe surface to Te decreased during subsequent depositions in the multisource vacuum-processing chamber, the depletion width narrowed until the devices formed with minimal Te exposure during CdTe surface preconditioning demonstrated a CV profile consistent with the higher efficiency devices formed using the first treatment.

The results of the TRPL measurements indicated a significant reduction in the minority carrier lifetime due to exposure to Te during preconditioning of the CdTe surface, as summarized in Table 4. The TRPL measurements (not shown) indicated that the TRPL decay rate is biexponential, with a fast ($\tau_1$) and slower ($\tau_2$) regime. As summarized in Table 4, both decay rates decreased as a result of Te exposure during surface preconditioning. Because the decay rates obtained using TRPL measurements are proportional to minority carrier lifetimes within the materials, the minority carrier lifetime within the solar cell was reduced due to exposure to Te during surface preconditioning.

TABLE 4

Effect of Te Surface Preconditioning on TRPL Decay Rates of CdS/CdTe Solar Cells

| Preconditioning Treatment | $\tau_1$ (ns) | $\tau_2$ (ns) |
|---|---|---|
| Full Te Exposure | 0.496 | 1.674 |
| Partial Te Exposure | 0.549 | 2.144 |
| No Te Exposure | 0.694 | 2.955 |

Figure 11:
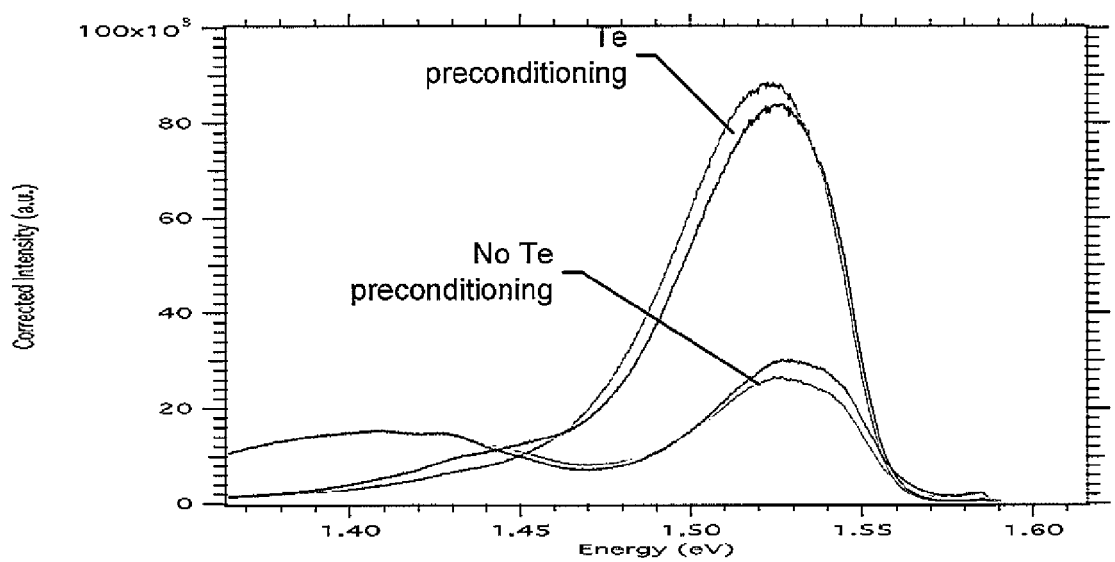
FIG. 11 is a graph summarizing LPTL spectra of photovoltaic devices exposed to varying concentrations of Te during the ohmic contact fabrication process.

The results of the LTPL analysis indicate significant changes to the composition of the CdTe layer due to Te surface preconditioning, as summarized in FIG. 11. The spectra illustrated in FIG. 11 show a peak centered at ~1.520 eV that was significantly reduced in intensity in the absence of Te exposure. The peaks in this spectral region were likely influenced by luminescence from the $CdS_xTe_{x-1}$ alloy region of the device. In addition, a broad spectral peak centered at about 1.4 eV becomes more pronounced as Te exposure is reduced. Broad peaks in the 1.4 eV region have been observed previously with high-performance CdS/CdTe devices contacted with a ZnTe:Cu interface layer, and are believed to be associated with the formation of a defect pair that includes of a copper interstitial and a substitutional O on a Te site ($Cu_i$+ $O_{Te}$); luminescence in the 1.4 eV region may also be associated with Cu coordinating beneficially within the junction region. Subsequent SIMS analysis (not shown) indicated that the all solar cells contained comparable Cu concentrations, independent of Te exposure during CdTe surface preconditioning.

The results of this experiment demonstrated that the modification of the exposed CdTe layer prior to the formation of the ohmic contact may have unexpected effects on the efficiency of the resulting CdTe thin film solar cell. The composition of the underlying CdTe layer may contribute substantially to the efficiency of the solar cell, and not all ohmic contact configurations may be compatible with all CdTe polycrystalline compositions, regardless of the surface preconditioning of the CdTe layer.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of depositing a layer of a material comprising polycrystalline CdTe onto a substrate, the method comprising:
   providing to a deposition process a source material comprising an amount of Cd and an amount of Te to form the polycrystalline CdTe having a non-stoichiometric ratio, wherein:
   the non-stoichiometric ratio consists of either:
      a Cd-rich ratio having a larger atomic percentage of Cd relative to the atomic percentage of Te; or
      a Te-rich ratio having a larger atomic percentage of Te relative to the atomic percentage of Cd.

2. The method of claim 1, wherein the source material comprises any one or more of: a solid source of Te; a vapor source of Te; a solid source of Cd; a vapor source of Cd; and a solid CdTe source material that yields the amount of Te and the amount of Cd.

3. The method of claim 2, wherein an additional amount of Te or Cd is provided during a thermal treatment of the material after deposition process.

4. The method of claim 3, wherein the additional amount of Te or Cd is sufficient to form an additional layer of a second material consisting essentially of Te or Cd.

5. The method of claim 1, wherein the Cd is delivered from the source material to the substrate at an atomic percentage of Cd up to about 10 times the atomic percentage of the Te.

6. The method of claim 1, wherein the Te is delivered from the source material to the substrate at an atomic percentage of Te up to about 10 times the atomic percentage of the Cd.

7. The method of claim 1, wherein the material has a minority carrier lifetime of at least 10 ns.

8. The method of claim 1, wherein the deposition process is chosen from:
   physical vapor deposition, close-space sublimation, vapor transport deposition, sputter deposition, electrodeposition, electroless deposition, metal organic chemical vapor deposition, spray deposition, screen print deposition, application of nanostructures, and any combination thereof.

9. The method of claim 8, wherein the deposition process is chosen from:
   physical vapor deposition, close-space sublimation, vapor transport deposition, and any combination thereof.

10. The method of claim 9, wherein the deposition process is conducted at essentially vacuum pressure and at a temperature ranging from about 250° C. to about 700° C.

11. The method of claim 1, wherein the substrate comprises a CdS material.

12. The method of claim 1, wherein the source material is a solid crystalline CdTe source material that has the non-stoichiometric ratio.

13. The method of claim 1, wherein the non-stoichiometric ratio consists of the Cd-rich ratio.

14. The method of claim 1, wherein the non-stoichiometric ratio consists of the Te-rich ratio.

* * * * *